US010164315B2

(12) United States Patent
Forstner et al.

(10) Patent No.: US 10,164,315 B2
(45) Date of Patent: Dec. 25, 2018

(54) APPARATUSES AND METHODS FOR SIGNAL COUPLING

(71) Applicant: Infineon Technologies AG, Neubiberg (DE)

(72) Inventors: Johann Peter Forstner, Steinhoering (DE); Vadim Issakov, Munich (DE); Saverio Trotta, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 29 days.

(21) Appl. No.: 15/599,185

(22) Filed: May 18, 2017

(65) Prior Publication Data

US 2018/0013188 A1 Jan. 11, 2018

(30) Foreign Application Priority Data

May 20, 2016 (DE) ........................ 10 2016 109 359

(51) Int. Cl.
| | | |
|---|---|---|
| *H03F 3/45* | (2006.01) | |
| *H01P 5/18* | (2006.01) | |
| *H03H 7/46* | (2006.01) | |
| *H01F 38/14* | (2006.01) | |
| *H01L 23/64* | (2006.01) | |
| *H03F 1/02* | (2006.01) | |
| *H03F 1/56* | (2006.01) | |
| *H03F 3/195* | (2006.01) | |
| *H03H 7/24* | (2006.01) | |
| *H03H 7/09* | (2006.01) | |
| *H03F 3/26* | (2006.01) | |

(52) U.S. Cl.
CPC .............. *H01P 5/18* (2013.01); *H01F 38/14* (2013.01); *H01L 23/645* (2013.01); *H03F 1/0261* (2013.01); *H03F 1/56* (2013.01); *H03F 3/195* (2013.01); *H03H 7/09* (2013.01); *H03H 7/24* (2013.01); *H03H 7/46* (2013.01)

(58) Field of Classification Search
CPC .... H03B 5/02; H03B 5/12; H03F 3/20; H03F 3/26; H03F 3/45; H03F 2200/534
USPC ........................................................ 333/24 R
See application file for complete search history.

(56) References Cited

U.S. PATENT DOCUMENTS

| | | | | |
|---|---|---|---|---|
| 2,122,401 A | * | 7/1938 | Armstrong ............... | H03D 7/08 307/3 |
| 7,532,001 B2 | * | 5/2009 | Lee ....................... | H03B 5/1228 324/127 |
| 8,232,850 B2 | * | 7/2012 | Rofougaran ............. | H04B 1/18 333/101 |
| 8,489,035 B2 | * | 7/2013 | Chiang ..................... | H03F 3/24 330/10 |

(Continued)

FOREIGN PATENT DOCUMENTS

| | | |
|---|---|---|
| DE | 102014103344 A1 | 9/2014 |
| DE | 102014114200 A1 | 4/2015 |
| DE | 102014203228 A1 | 8/2015 |

*Primary Examiner* — Dean Takaoka
(74) *Attorney, Agent, or Firm* — Slater Matsil, LLP

(57) ABSTRACT

Coupling apparatuses, circuits having such coupling apparatuses and corresponding methods are provided that involve a first and a second signal being coupled out from an out-coupling circuit part and being separately coupled into first and second circuit pmts. The use of different coupling mechanisms effects signal separation in this case. In particular, one of the signals can be coupled as a differential signal and the other as a common mode signal.

18 Claims, 10 Drawing Sheets

(56) References Cited

U.S. PATENT DOCUMENTS

| | | |
|---|---|---|
| 9,319,006 B2 | 4/2016 | Solomko et al. |
| 2013/0258911 A1* | 10/2013 | Choksi .................... H03H 7/09 370/277 |
| 2014/0273825 A1 | 9/2014 | Sapone et al. |
| 2015/0244054 A1 | 8/2015 | Oppelt |

* cited by examiner

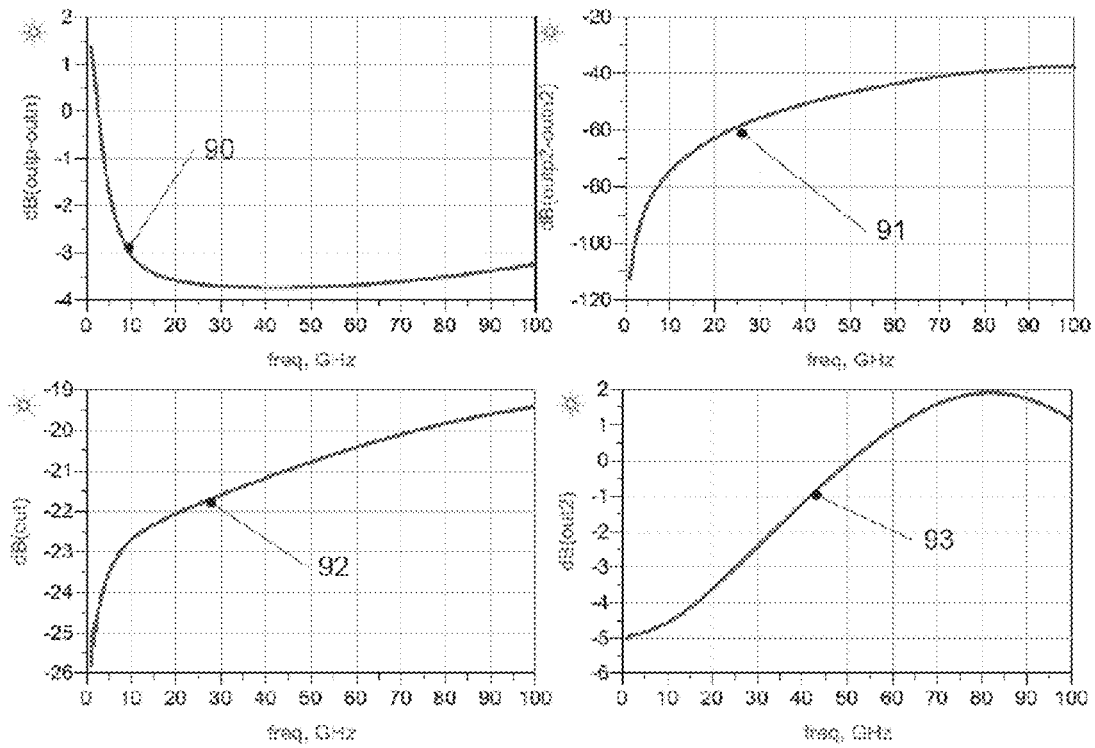
Fig. 9
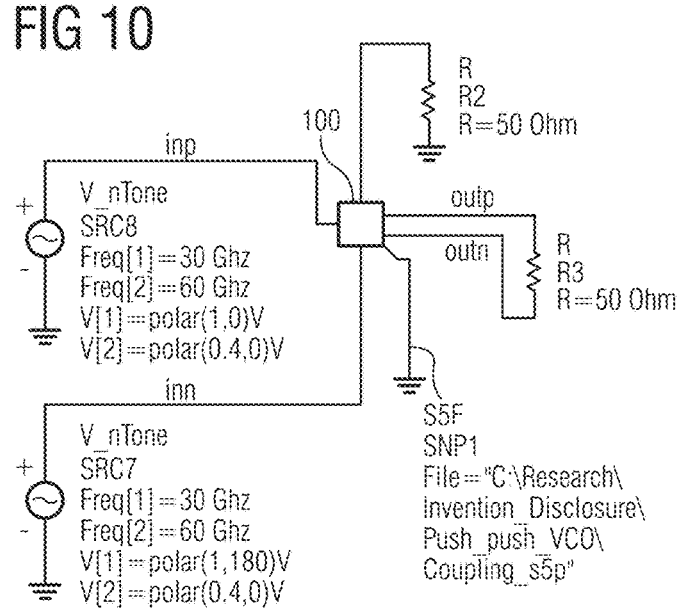

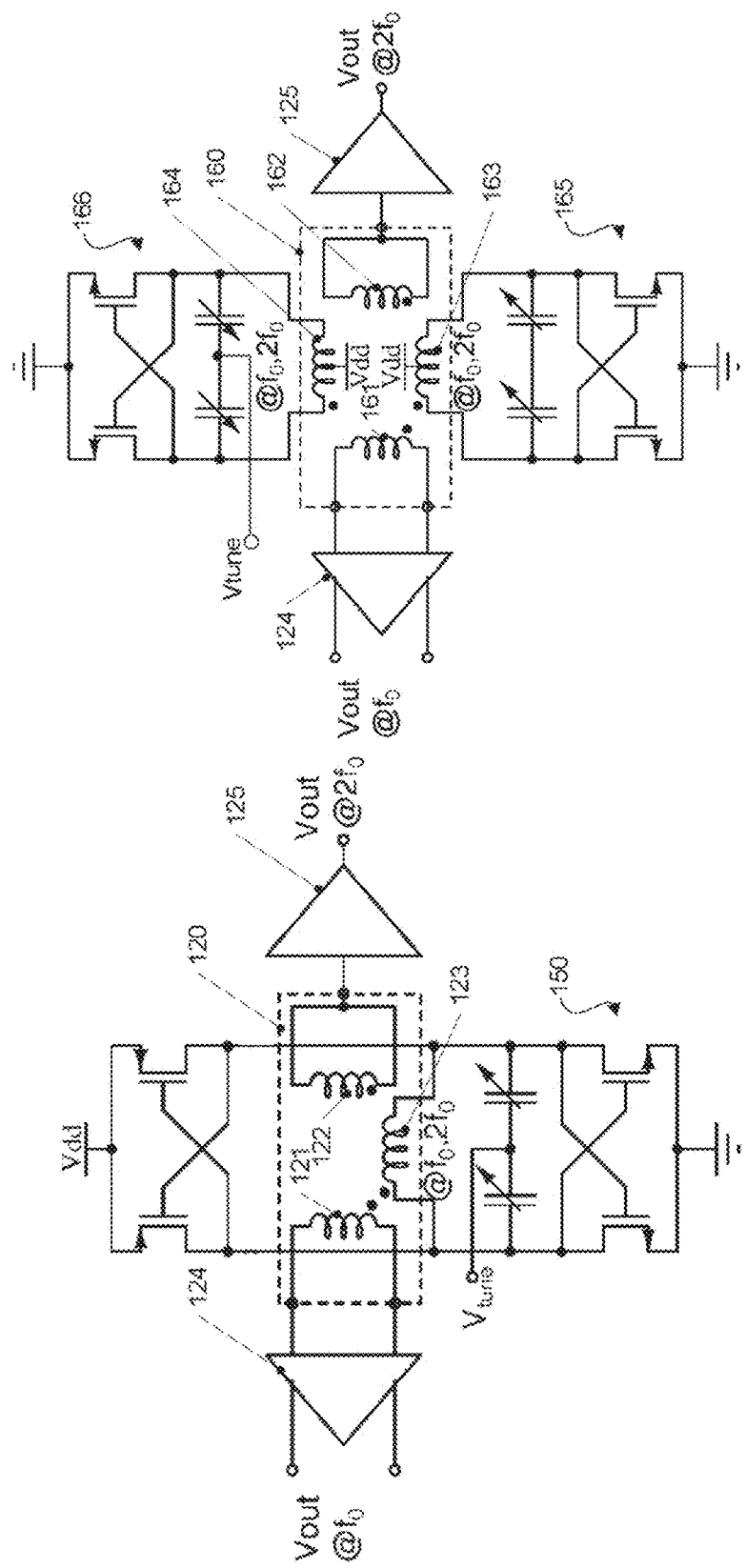

APPARATUSES AND METHODS FOR SIGNAL COUPLING

CROSS-REFERENCE TO RELATED APPLICATIONS

This application claims priority to German patent application No. 102016109359.9, filed on May 20, 2016, which application is incorporated herein by reference in its entirety.

TECHNICAL FIELD

The present application relates to methods and apparatuses for signal coupling, i.e. for coupling signals, for example, from one circuit part to another circuit part. In particular, the present application relates to signal couplings of radio frequency signals, for example at a frequency above 1 GHz.

BACKGROUND

Many applications require signals, in particular radio frequency signals, that are produced or processed in one circuit part to be provided to another circuit part of a circuit for further use. By way of example, in some applications, signals produced by an oscillator such as a Voltage Controlled Oscillator (VCO) need to be supplied to a frequency divider chain, a transmission circuit or a reception circuit, signals from a frequency doubler need to be supplied to further circuit parts, or part of an output from a transmission circuit needs to be supplied to a diagnosis circuit such as a power detector for test purposes.

For such coupling out of signals from one circuit and coupling in another circuit, it is in many cases desirable or necessary for the operation of the circuit part from which the signal (or multiple signals) is coupled out (subsequently also referred to as the out-coupling circuit part) to be influenced as little as possible. In particular, it is desirable in the case of many applications for such coupling out of a signal to provide as small a load as possible for the out-coupling circuit part.

This is critical particularly when there are many applications in which high frequencies, for example corresponding to millimeter waves (in the range of greater than GHz, for example), are used. An example that may be cited in this case is a voltage controlled oscillator, which uses a resonator tank. When a load is connected directly to nodes of the resonator tank, this loads the resonator tank and influences the phase noise.

In addition, for some applications, it is desirable to couple out a signal not only at one frequency but rather to couple out signals at different frequencies separately from one another from a single circuit. An example may be the coupling out of a higher harmonic of the fundamental signal of an oscillator. If a voltage controlled oscillator operates at a fundamental signal of 30 GHz, for example, then some implementations have a second harmonic at 60 GHz at some nodes. In some oscillator configurations, for example in what is known as a push-push configuration, the fundamental signal (e.g. 30 GHz) is then supplied to a frequency divider chain, and the second harmonic (e.g. 60 GHz) is supplied to a receiver or transmitter. Two frequencies can also occur simultaneously for frequency doublers, circulators or duplexers.

Conventionally, such coupling out of multiple signals at different frequencies is effected by direct coupling, the load being decreased by using smaller transistors, for example, in order to decrease a (parasitic) load capacitance. Nevertheless, this may result in impairments to the circuit from which the coupling out is effected. In addition, such approaches can give rise to additional parasitic effects. Finally, reduction of structures such as transistors also has its limits.

SUMMARY

Coupling apparatuses, circuits having such coupling apparatuses and corresponding methods are provided that involve a first and a second signal being coupled out from an out-coupling circuit part and being separately coupled into first and second circuit parts. The use of different coupling mechanisms effects signal separation in this case. In particular, one of the signals can be coupled as a differential signal and the other as a common mode signal.

The summary above provides only a brief overview and is not intended to be interpreted as limiting.

BRIEF DESCRIPTION OF THE DRAWINGS

FIG. 9 shows results of simulations on the basis of the circuits of FIGS. 8A and 8B;

FIG. 10 shows a circuit as a basis for simulations;

FIG. 12-19 show circuits according to different embodiments; and

DETAILED DESCRIPTION OF ILLUSTRATIVE EMBODIMENTS

Various embodiments are explained in more detail below with reference to the enclosed figures. These embodiments serve merely for illustration and are not intended to be interpreted as limiting. As such, a description of an embodiment having a plurality of features is not intended to be interpreted to the effect that all of these features are necessary for implementation. Rather, in other embodiments, some of the depicted features or components may be omitted and/or may be replaced by alternative features or components. Additionally, further features or components, for example features or components of conventional radio frequency circuits, may be provided in addition to the features or components depicted and described.

Variations and modifications that are described for one of the embodiments may also be applicable to other embodiments. Features or components of different embodiments can additionally be combined with one another in order to form further embodiments.

In the embodiments described, direct connections, i.e. connections without intervening elements (for example by single conductor tracks) can also be replaced by indirect connections, i.e. connections having one or more additional intervening elements, and vice versa, so long as the basic function of the connection, for example to transmit a particular signal, to cause a particular control or to transmit a particular type of information, is essentially maintained.

In embodiments, different coupling mechanisms are used in order to couple two signals at different frequencies from one circuit part to another circuit part. In this case, the coupling in some embodiments is effected with DC isolation, i.e. without ohmically conductive connection. In some embodiments, an out-coupling circuit part is provided with only a single coupling element in this case.

Figure 1:
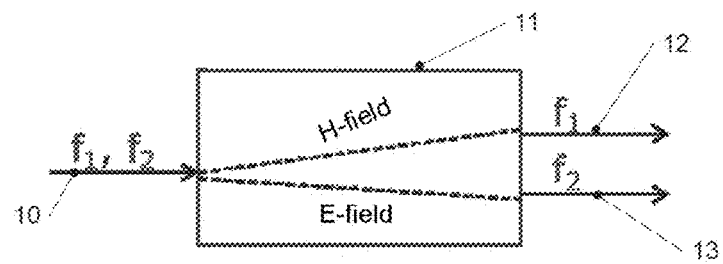
FIG. 1 is a schematic depiction of an apparatus according to an embodiment.

In some embodiments, particularly a first signal is coupled out using an inductive coupling, i.e. coupling via a magnetic field, and a second signal is coupled out via a capacitive coupling, i.e. based on an electric field. This is depicted schematically in FIG. 1. An out-coupling circuit part 10 has a first and a second signal at different frequencies $f_1$, $f_2$. An out-coupling device 11 is then used to couple out the first signal at the frequency $f_1$ to a first circuit part 12 by using a magnetic coupling (H-field coupling) and the second signal at the frequency $f_2$ to a second circuit part 13 via a coupling that uses the electric field (E-field coupling). In this case, it should be noted that "magnetic field" and "electric field" denote the preponderant, i.e. dominant coupling mechanisms (magnetic induction or coupling mainly by E-field, e.g. by charge influence (also referred to as electrostatic induction) similarly to the signal transmission of AC signals via a capacitor), which does not mean that the other field is not present at all. The couplings are explained in more detail later.

The different types of coupling mean that in some embodiments the second signal at the frequency $f_2$ is rejected in the first circuit part 12, and the first signal at the frequency $f_1$ is rejected in the second circuit part 13.

To realize such couplings, some embodiments involve the first signal being coupled as a differential signal and the second signal being coupled as a unipolar signal into the first and second circuit parts, respectively. The terms "common mode signals" and a "unipolar signal" are used substantially synonymously below. In this regard, a single coil may be provided on the out-coupling circuit part 10, for example. This is explained in more detail later.

Figure 2:
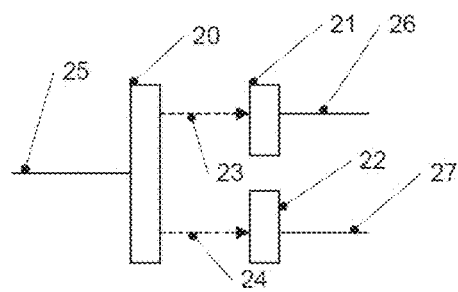
FIG. 2 is a block diagram of an apparatus according to an embodiment.

FIG. 2 schematically shows an apparatus according to an embodiment.

In the embodiment in FIG. 2, a first signal and a second signal, which have different frequencies, are supplied by an out-coupling circuit part 25 to a single transmission element 20. In this case, the first signal can be supplied as a differential signal and the second signal can be supplied as a unipolar signal or common mode signal. The transmission element 20 may, by way of example, be a first coil. The first signal is then received by a first reception element 21, as indicated by means of an arrow 23, in order to be used further in a first circuit part 26. In the coupling path 23, the second signal is rejected. The first reception element 21 may, by way of example, be a differential coil in order to receive the first signal as a differential signal.

The second signal is transmitted via a coupling path 24 to a second reception element 22, which may be a unipolar reception element, for example a "closed" coil as will be explained in more detail later. The differential first signal is rejected in the coupling path 24. In this way, the second signal is supplied to a second circuit part 27.

As a result of a differential signal and a unipolar signal (common mode signal) being used, a single transmission element is therefore adequate for coupling. This reduces a required chip area in some embodiments, for example.

Figure 3:
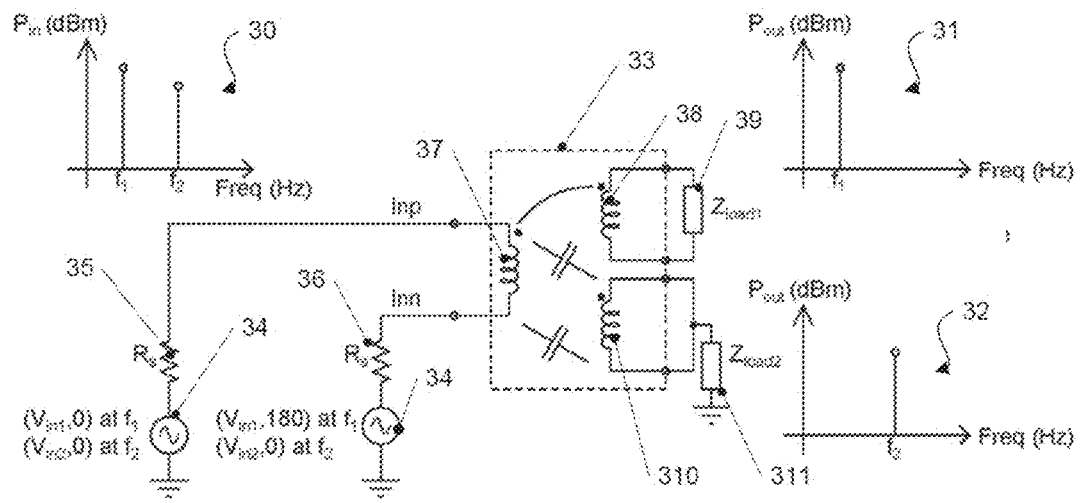
FIG. 3 is a circuit diagram of an apparatus according to an embodiment.

FIG. 3 shows a circuit diagram of an embodiment in order to explain some basic techniques that are used in some embodiments. The embodiment of FIG. 3 comprises a coupling apparatus 33. The coupling apparatus 33 comprises a transmission coil 37 for coupling out signals from an out-coupling circuit part, a first reception coil 38 and a second reception coil 310.

The transmission coil 37 is supplied with a first signal at a first amplitude $V_{in1}$ and a first frequency $f_1$ and with a second signal at an amplitude $V_{in2}$ and a second frequency $f_2$ at inputs Inp, Inn. To produce the signals, signal generators 34 are schematically depicted. As will be explained later, the signal generators 34 may for example comprise oscillator circuits, frequency divider circuits or multiplier circuits, but are not restricted thereto.

The first and second signals are in this case, in the representation of FIG. 3, supplied to the inputs Inp, Inn via source impedances 35, 36 having resistance values $R_S$. The source impedances 35, 36 here represent impedances of circuits that are used for producing the first and second signals, e.g. oscillator circuits, in the depicted model.

As illustrated in FIG. 3, the first signal is in this case a differential signal that is supplied to source impedance 35 at a 0° phase angle and to source impedance 36 at a 180° phase angle, so that a differential signal is obtained. The second signal is by contrast supplied as a common mode signal, in which the components supplied to resistor 35 and to resistor 36 have an identical phase angle. In other words, both terminals of the transmission coil 37 are supplied with the same signal for the second signal. A graph 30 schematically depicts a spectrum of the input power for the transmission coil 37 over frequency, the depicted example having substantial components only at frequencies $f_1$ and $f_2$. Both signals are supplied to the transmission coil 37 at similarly high power.

First reception coil 38 has two terminals that are coupled to corresponding terminals of a load 39. The signal coupled into the first reception coil 38 can then be tapped off from the load 39. The differential configuration with two terminals couples in the first signal at the frequency f1 in this case, whereas the second signal is rejected at the frequency f2. This is a coupling by magnetic induction, as already explained briefly with reference to FIG. 1 and as will be explained further later. Second reception coil 310 has interconnections that are both connected to a first terminal of a load 311, while a second terminal of the load 311 is connected to ground. A signal coupled into second reception coil 310 may be tapped at load 311. In this case, the unipolar configuration means that substantially only the second signal is received at the frequency f2, whereas the first signal is rejected at the frequency f1.

This is depicted schematically in graphs 31 and 32. Graph 31 shows the power $P_{out}$ that is coupled into the first reception coil 38. As depicted schematically, a signal is received substantially only at the frequency $f_1$ in this case. Graph 32 shows the same for the second reception coil 310. In this case, a signal is received substantially only at second frequency $f_2$, whereas the signal is rejected at first frequency $f_1$.

The use of a single transmission coil 37 means that, as already mentioned, the coupling apparatus 33 may be designed compactly, and no totally separate components are needed for the two couplings. Additionally, the coupling is realized with DC isolation, i.e. without a direct ohmic connection, which decreases a load for the out-coupling circuit part and therefore impairs the manner of operation of the out-coupling circuit part less. In some embodiments, it is thus possible, by way of example, to couple out a fundamental and a higher harmonic, for example in the case of a voltage controlled oscillator in which a second harmonic can be coupled out without needing an additional current source to ground, for example. Corresponding embodiments are explained in more detail later.

The manner of operation of the depicted circuits, particularly of the circuit of FIG. 3, with different coupling types (coupling via magnetic field and coupling via electric field) will now be explained in more detail with reference to FIGS. 4-6.

Figure 4:
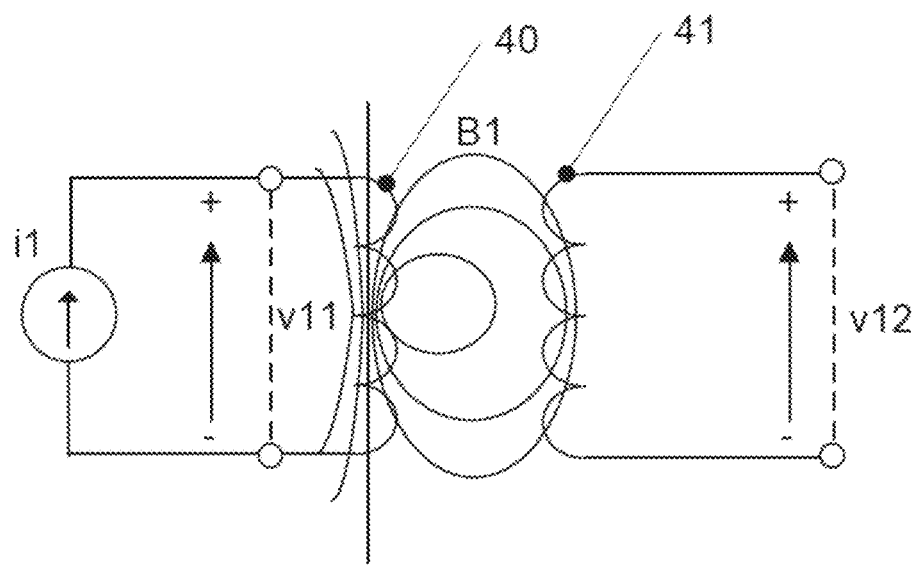
FIGS. 4, 5, 6A and 6B are different depictions to explain the manner of operation of embodiments.

FIG. 4 explains a usual inductive coupling between two coils 40, 41, which correspond to the first coil 37 and the second coil 38, for example, in the case of FIG. 3. FIG. 4 depicts a magnetic flux through the second coil 41, which by a magnetic field $B_1$ that is generated by first coil 40 as a result of a current $i_1$. This leads to an induced voltage $v_{21}$ in second coil 41. The magnetic flux through first coil 40 and through the second coil is in this case the integral of the magnetic field B1 over the cross-sectional area of the coil.

A corresponding induction may also take place from second coil 41 to first coil 40. This corresponds to the conventional magnetic induction between two coils and is therefore not explained in more detail. As is evident from FIG. 4, this induction requires a respective differential signal connection for first coil 40 and second coil 41, so that induction can be used to couple, by way of example, a first signal from the transmission coil 37 into the first reception coil 38 of FIG. 3.

Figure 5:
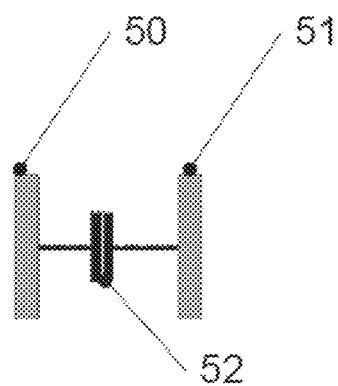

FIG. 5 shows a corresponding situation for unipolar signals (common mode signals) for which a voltage is applied to both terminals of the first coil, corresponding to application of the second signal at the frequency $f_2$ to the transmission coil 37 of FIG. 3. Accordingly, a voltage is tapped at the second coil. In this case, the coils essentially act as plates of a capacitor 52, as illustrated in FIG. 5. The reference numerals 50 and 51 denote a first circuit part, which produces a signal to be coupled out, and a second circuit part, which receives the signal, respectively.

Hence, FIGS. 4 and 5 are used to illustrate how differential signals have been transmitted by means of magnetic induction and common mode signals (unipolar signals) via an electric field.

This is explained more precisely mathematically below.

The text below explains the mathematical/network theory background to an idealized case with reference to FIGS. 6A and 6B. First of all, referring to FIG. 6A, the case of a reception coil coupled in a unipolar manner and having an inductance $L_2$ is depicted for a transmission coil $L_1$. The differential signal supplied to terminals 1 and 2 of the coil $L_1$ are signals $+v_1 e^{j\omega_1 t}$, $-v_1 e^{j\omega_1 t}$, where j is the imaginary unit, $v_1$ is the amplitude of the first signal, t is the time and $\omega_1$ is the angular frequency of the first signal. The common mode signal supplied to both terminals is a signal $v_2 e^{j\omega_2 t}$, where again t is the time, j is the imaginary unit, $\omega_2$ is the angular frequency of the second signal and $v_2$ is the amplitude of the second signal. C denotes capacitive couplings between the coils.

The analysis below will use what is known as modified nodal analysis (MNA). In this case, it holds that $x = A^{-1} \cdot z$, where A is a matrix that describes the coupling between nodes, x is a matrix that contains unknown variables (particularly the voltages and currents coupled in at the receiver end) and z is a matrix that contains the sources (i.e. the signals coupled into the transmission coil).

For the case of differential excitation (first signal) in FIG. 6A, the above equation can be written as follows:

$$x = \begin{bmatrix} \frac{1}{j\omega L_1(1-k^2)} + j\omega C & -\frac{1}{j\omega L_1(1-k^2)} & -j\omega C & 1 & 0 \\ -\frac{1}{j\omega L_1(1-k^2)} & \frac{1}{j\omega L_1(1-k^2)} + j\omega C & -j\omega C & 0 & 1 \\ -j\omega C & -j\omega C & \frac{1}{R_L} & 0 & 0 \\ 1 & 0 & 0 & 0 & 0 \\ 0 & 1 & 0 & 0 & 0 \end{bmatrix}^{-1}$$

$$\begin{bmatrix} 0 \\ 0 \\ 0 \\ v_1 e^{j\omega_1 t} \\ -v_1 e^{j\omega_1 t} \end{bmatrix} = \begin{bmatrix} v_1 e^{j\omega_1 t} \\ -v_1 e^{j\omega_1 t} \\ 0 \\ \frac{v_1 e^{j\omega_1 t}(CL_1 k^2 \omega^2 - CL_1 \omega^2 + 2)}{j\omega L_1(1-k^2)} \\ -\frac{v_1 e^{j\omega_1 t}(CL_1 k^2 \omega^2 - CL_1 \omega^2 + 2)}{j\omega L_1(1-k^2)} \end{bmatrix}$$

Figure 6A:
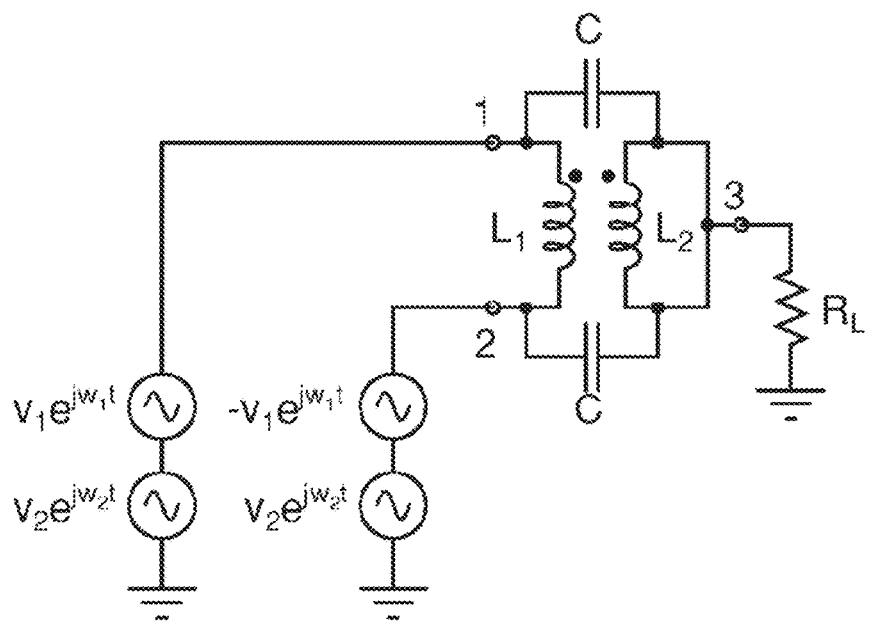
Figure 6B:
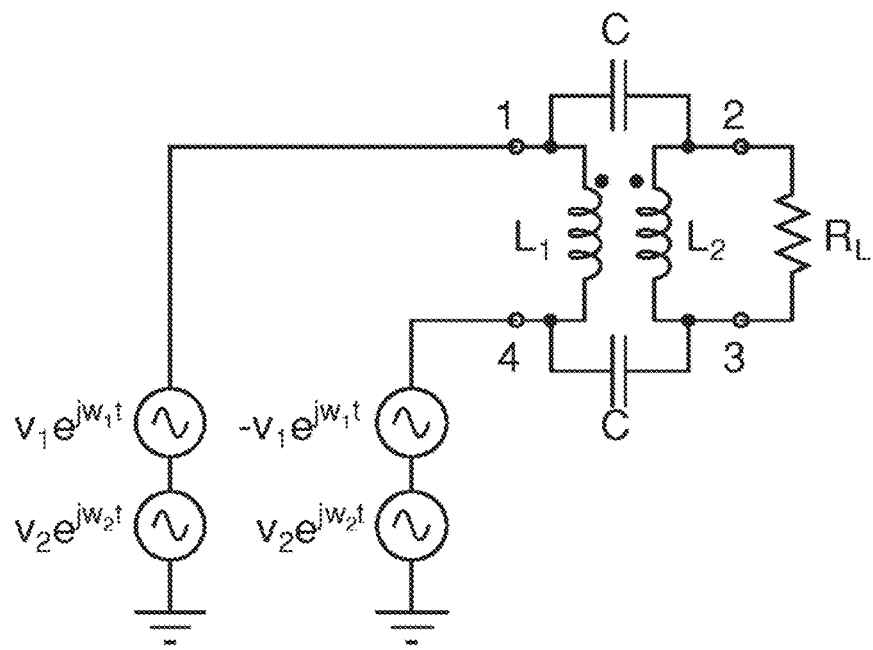

As can be seen, a zero is produced at node 3 in FIG. 6A (third row of the vector x), i.e. the differential input yields no signal contribution for the unipolar out-coupling depicted.

For the case of common mode excitation (second signal of FIG. 6A), the following equation is obtained:

$$x = \begin{bmatrix} \frac{1}{j\omega L_1(1-k^2)} + j\omega C & -\frac{1}{j\omega L_1(1-k^2)} & -j\omega C & 1 & 0 \\ -\frac{1}{j\omega L_1(1-k^2)} & \frac{1}{j\omega L_1(1-k^2)} + j\omega C & -j\omega C & 0 & 1 \\ -j\omega C & -j\omega C & \frac{1}{R_L} & 0 & 0 \\ 1 & 0 & 0 & 0 & 0 \\ 0 & 1 & 0 & 0 & 0 \end{bmatrix}^{-1}$$

$$\begin{bmatrix} 0 \\ 0 \\ 0 \\ v_2 e^{j\omega_2 t} \\ v_2 e^{j\omega_2 t} \end{bmatrix} = \begin{bmatrix} v_2 e^{j\omega_2 t} \\ v_2 e^{j\omega_2 t} \\ 2(j\omega R_L C) v_2 e^{j\omega_2 t} \\ -C\omega(2CR\omega + j) v_2 e^{j\omega_2 t} \\ -C\omega(2CR\omega + j) v_2 e^{j\omega_2 t} \end{bmatrix}$$

In this case, a signal corresponding to the second signal $v_2 e^{j\omega_2 t}$, which is attenuated by an RC filter, is thus obtained at the output node 3.

Next, the case of differential coupling out on the second coil at output nodes 2 and 3 is explained with reference to FIG. 6B. Otherwise, FIG. 6B corresponds to FIG. 6A.

First of all, the transmission of the first signal, i.e. a differential input signal, is explained for the differential output. In this case, the following equation is obtained.

$$x = \begin{bmatrix} \frac{1}{j\omega L_1(1-k^2)} + j\omega C & -\frac{k}{j\omega\sqrt{L_1 L_2}(1-k^2)} - j\omega C & \frac{k}{j\omega\sqrt{L_1 L_2}(1-k^2)} & -\frac{1}{j\omega L_1(1-k^2)} & 1 & 0 \\ -\frac{k}{j\omega\sqrt{L_1 L_2}(1-k^2)} - j\omega C & \frac{1}{j\omega L_2(1-k^2)} + j\omega C + \frac{1}{R_L} & -\frac{1}{j\omega L_2(1-k^2)} - \frac{1}{R_L} & \frac{k}{j\omega\sqrt{L_1 L_2}(1-k^2)} & 0 & 0 \\ \frac{k}{j\omega\sqrt{L_1 L_2}(1-k^2)} & -\frac{1}{j\omega L_2(1-k^2)} - \frac{1}{R_L} & \frac{1}{j\omega L_2(1-k^2)} + j\omega C + \frac{1}{R_L} & -\frac{k}{j\omega\sqrt{L_1 L_2}(1-k^2)} - j\omega C & 0 & 0 \\ -\frac{1}{j\omega L_1(1-k^2)} & \frac{k}{j\omega\sqrt{L_1 L_2}(1-k^2)} & -\frac{k}{j\omega\sqrt{L_1 L_2}(1-k^2)} - j\omega C & \frac{1}{j\omega L_1(1-k^2)} + j\omega C & 0 & 1 \\ 1 & 0 & 0 & 0 & 0 & 0 \\ 0 & 0 & 0 & 1 & 0 & 0 \end{bmatrix}^{-1} \cdot \begin{bmatrix} 0 \\ 0 \\ 0 \\ v_1 e^{j\omega_1 t} \\ -v_1 e^{j\omega_1 t} \end{bmatrix} =$$

$$\begin{bmatrix} v_1 e^{j\omega_1 t} \\ \frac{v_1 e^{j\omega_1 t} R\omega(CL\omega k^2 + 2k - CL\omega)}{CLRk^2\omega^2 - j2Lk^2\omega - CLR\omega^2 + j2L\omega + 2R} \\ \frac{v_1 e^{j\omega_1 t} R\omega(CL\omega k^2 + 2k - CL\omega)}{CLRk^2\omega^2 - j2Lk^2\omega - CLR\omega^2 + j2L\omega + 2R} \\ -v_1 e^{j\omega_1 t} \\ I(1) \\ I(2) \end{bmatrix}$$

If the signal is then tapped at nodes 2 and 3 in differential fashion, then the output signal obtained is $$V_{out} = V_2 - V_3 = 2 \cdot \frac{v_1 e^{j\omega_1 t} R\omega(CL\omega k^2 + 2k - CL\omega)}{CLRk^2\omega^2 - j2Lk^2\omega - CLR\omega^2 + j2L\omega + 2R}$$

i.e. the first signal with an attenuation that is dependent on the capacitances, inductances and resistances.

In the case of common mode excitation (second signal of FIG. 6B) and differential tapping, the following is obtained on the other hand Hence, the above explanations also use mathematical/ network theory to show that separation of the signals is possible by virtue of the different coupling mechanisms. It should be noted that, in practice, asymmetries nevertheless mean that small components of the second signal can be coupled to the first signal differentially, and parts of the first signal can be coupled to the second signal in common mode fashion. In other words, different effects can result in the signal separation not being effected 100%. For many applications, the signal separation is at any rate adequate, however.

$$\underline{x} = \begin{bmatrix} \frac{1}{j\omega L_1(1-k^2)} + j\omega C & -\frac{k}{j\omega\sqrt{L_1 L_2}(1-k^2)} - j\omega C & \frac{k}{j\omega\sqrt{L_1 L_2}(1-k^2)} & -\frac{1}{j\omega L_1(1-k^2)} & 1 & 0 \\ -\frac{k}{j\omega\sqrt{L_1 L_2}(1-k^2)} - j\omega C & \frac{1}{j\omega L_2(1-k^2)} + j\omega C + \frac{1}{R_L} & -\frac{1}{j\omega L_2(1-k^2)} - \frac{1}{R_L} & \frac{k}{j\omega\sqrt{L_1 L_2}(1-k^2)} & 0 & 0 \\ \frac{k}{j\omega\sqrt{L_1 L_2}(1-k^2)} & -\frac{1}{j\omega L_2(1-k^2)} - \frac{1}{R_L} & \frac{1}{j\omega L_2(1-k^2)} + j\omega C + \frac{1}{R_L} & -\frac{k}{j\omega\sqrt{L_1 L_2}(1-k^2)} - j\omega C & 0 & 0 \\ -\frac{1}{j\omega L_1(1-k^2)} & \frac{k}{j\omega\sqrt{L_1 L_2}(1-k^2)} & -\frac{k}{j\omega\sqrt{L_1 L_2}(1-k^2)} - j\omega C & \frac{1}{j\omega L_1(1-k^2)} + j\omega C & 0 & 1 \\ 1 & 0 & 0 & 0 & 0 & 0 \\ 0 & 0 & 0 & 1 & 0 & 0 \end{bmatrix}^{-1} \cdot \begin{bmatrix} 0 \\ 0 \\ 0 \\ v_1 e^{j\omega_1 t} \\ -v_1 e^{j\omega_1 t} \end{bmatrix} =$$

$$\begin{bmatrix} v_1 e^{j\omega_1 t} \\ v_1 e^{j\omega_1 t} \\ v_1 e^{j\omega_1 t} \\ v_1 e^{j\omega_1 t} \\ 0 \\ 0 \end{bmatrix}$$

In this case, the differential output signal obtained on nodes 2 and 3 is then zero in accordance with $$V_{out} = V_2 - V_3 = 0$$

which means that no signal is transmitted in this case.

Figure 7A:
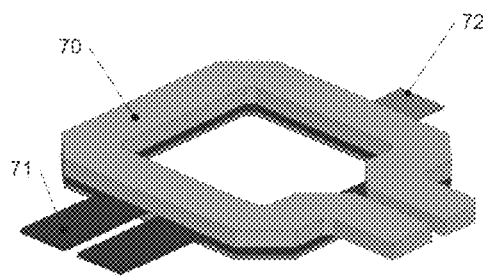
FIG. 7A-7C show perspective views of an apparatus according to an embodiment.
Figure 7B:
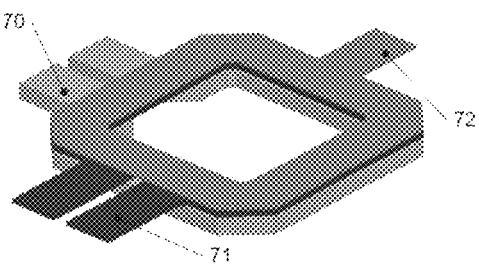
Figure 7C:
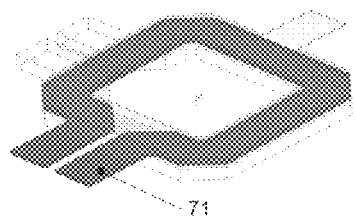

Next, referring to FIG. 7, an implementation example for a coupling apparatus is explained. In this case, FIG. 7A shows a plan view of the coupling apparatus, FIG. 7B shows a view of an underside of the coupling apparatus and FIG. 7C shows a highlight of a part of the apparatus. The term "plan view" and "view from below" serve merely for easier association, and the depicted apparatus can be used in any desired orientation.

The apparatus of FIG. 7 comprises a transmission coil 70, also referred to as the main coil, that may be used as the coil 37 of FIG. 3, for example. In the case depicted, the transmission coil 70 has a single winding. The terminals of coil 70 then have a first signal applied to them as a differential signal and a second signal applied to them as a common mode signal, for example.

Furthermore, the apparatus of FIG. 7 comprises a first reception coil 71 and a second reception coil 72, which likewise each have one winding and have the same coil shape as transmission coil 70 and are arranged in stacked fashion as shown. The coils themselves may in this case be formed by metal conductor tracks, for example, and isolated from one another by nonconductive dielectric material, for example silicon dioxide or silicon nitride.

In this case, first reception coil 71 has, as shown, two terminals in order to allow differential tapping as discussed above. Second reception coil 72 has, as depicted, only a single terminal and may therefore be used as the second reception coil 310 of FIG. 3, for example, and acts substantially as a capacitor plate as explained. It should be noted that the order of coils is understood only as an example, and the coils can also be arranged in a different order, for example transmission coil 70 between the reception coils 71, 72. Additionally, the shape of the coils may also be different from the one shown. Furthermore, further coils, e.g. a second transmission coil or further reception coils, may also be provided. An apparatus as depicted in FIG. 7 allows a compact implementation. Other implementations are likewise possible, however.

To demonstrate the manner of operation, simulation results are now discussed with reference to FIGS. 8-11. It should be noted that these simulation results serve only for further illustration and, depending on the implementation, results and signals may differ therefrom in real circuits.

Figure 8A:
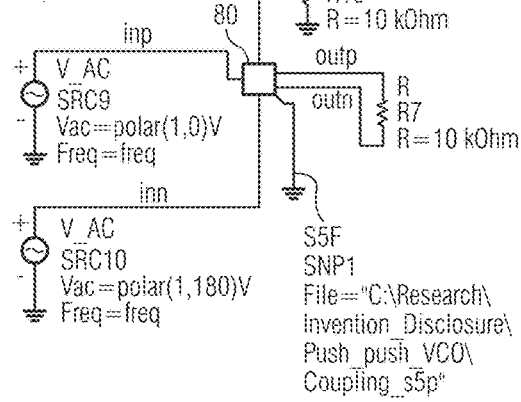
FIGS. 8A and 8B show circuits that serve as a basis for simulations.
Figure 8B:
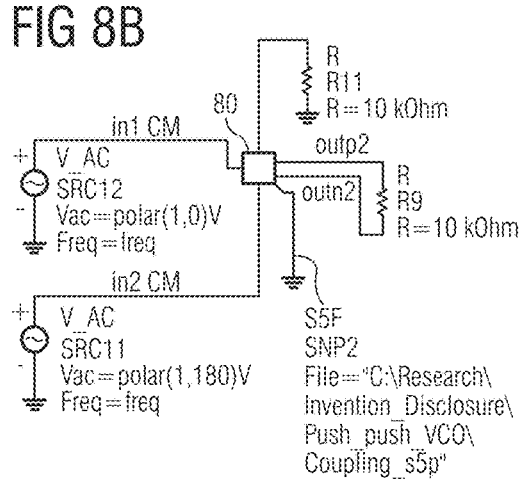

FIGS. 8A and 8B show diagrams of circuits that have been used for simulation. In this case, FIG. 8A shows the case of a differentially supplied signal, and FIG. 8B shows the case of a unipolar signal, as explained by the phase difference 180 in FIG. 8A and 0 in FIG. 8B. 80 denotes the simulated coupling apparatus, for example in accordance with FIG. 7. The different resistance values and frequency values that are indicated in FIGS. 8A and 8B serve merely as a simulation example for further illustration, and, depending on the application, the values used may differ. Accordingly, the results may also differ, and the depicted simulations serve merely for illustration.

FIG. 9 shows simulation results for the circuits of FIGS. 8A and 8B for different cases. In this case, FIG. 9 indicates the attenuation in decibels over frequency in each case. A curve 90 shows the differential output signal in the case of FIG. 8A, i.e. for the differential input signal. As can be seen, there is only low attenuation (less than −4 dB) in this case. The curve 92 shows the common mode output of FIG. 8A. In this case, there is relatively high attenuation, which is in the range from −19 and −20 dB even at a high frequency of 100 GHz. In the case of FIG. 8A, the differential signal is thus transmitted to the differential output, but not to a common mode output.

Curves 91 and 93 show corresponding cases for FIG. 8B. A curve 91 shows the differentially tapped output signal in the case of common mode excitation. In this case, depending on the frequency, attenuations in the range from −40 to −110 dB are obtained. For the common mode output, only low attenuations are obtained. In this case, the common mode signal is thus transmitted, while there is barely crosstalk to the differential output.

In this case, for the depicted simulation result, the crosstalk by the common mode input signal to the differential output is lower than the crosstalk by the differential input signal to the common mode output. This is illustrated with reference to FIGS. 10 and 11 on the basis of a further simulation. FIG. 10 shows a circuit on which the simulation is based, where 100 denotes a coupling apparatus such as the coupling apparatus of FIG. 7. As example signals, a signal at the frequency 30 GHz has been used as differential signal and a signal at the frequency 60 GHz (for example second harmonic) has been used as common mode signal. Again, all of the numerical values indicated are intended to be understood only as an example for the purpose of illustration.

Figures 11A, 11B:
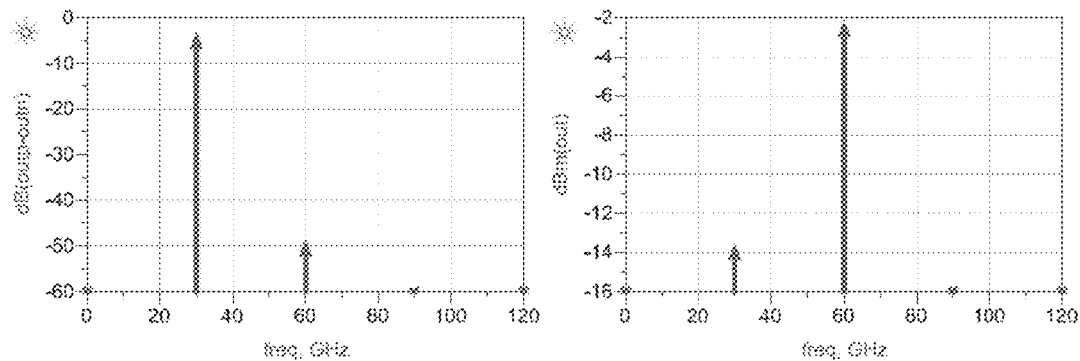
FIGS. 11A and 11B show results of simulations on the basis of the circuit of FIG. 10.

FIG. 11A shows the signal components at the differential output (corresponding to the coil 38 of FIG. 8 or the reception coil 71 of FIG. 7, for example), and FIG. 11B shows the relative signal strengths at the unipolar output (for example via the coil 310 of FIG. 3 or the coil 72 of FIG. 7). As can be seen, the signal supplied as a common mode signal is rejected (by approximately −50 dB) at the differential output (FIG. 11A), while the differentially supplied signal is rejected (but to a lower extent of approximately −14 dB) at the common mode output. This signal separation is adequate for many applications.

The text below now discusses different apparatuses as application examples of the coupling apparatuses according to the invention. The coupling apparatuses may in this case be implemented in detail as discussed above, for example as shown in FIG. 7, but are not restricted thereto. The depicted application examples are furthermore not intended to be interpreted as limiting, and coupling apparatuses according to embodiments can also be used for other applications.

Figure 12:
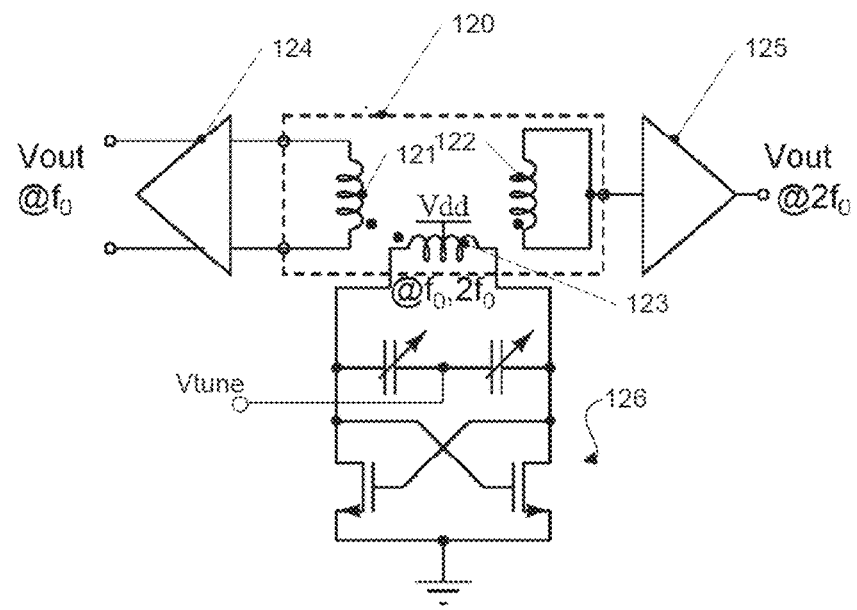

FIG. 12 shows a circuit in which an embodiment of a coupling apparatus 120 is used for coupling out signals from a push-push voltage controlled oscillator 126. In the example depicted, the voltage controlled oscillator 126 is implemented with two cross-coupled NMOS transistors and two variable capacitances to which a tuning voltage $V_{Tune}$ is supplied.

Apparatus 120 comprises a transmission coil 123 that is coupled to oscillator 126 such that said transmission coil is supplied with a fundamental signal from the oscillator at a frequency $f_0$ as differential signal and with a harmonic at the frequency $2f_0$ as common mode signal. Furthermore, apparatus 120 comprises a first reception coil 121 for transmitting the differential signal at the frequency $f_0$ and a second coil 122, the ends of which are connected to one another, for receiving the common mode signal at the frequency $2f_0$. Transmission coil 123 and reception coils 121, 122 operate as explained above, for example as explained with reference to FIG. 3, and may be implemented as depicted in FIG. 7, for example, but are not restricted thereto. First reception coil 121 has a first (differential) buffer 124 coupled to it, via which an output signal $V_{out}$ at the frequency $f_0$ is then output. Second reception coil 122 has a second (in this case unipolar) buffer 125 connected to it in order to output a signal $V_{out}$ at the frequency $2f_0$.

In this way, both the signal at the frequency $f_0$ and the harmonic at the frequency $2f_0$ may be coupled out in a noninvasive manner, which barely disturbs or does not at all disturb the operation of the oscillator.

The depicted oscillator 126 is intended to be understood only as an example, and different variations and modifications are possible. Some of these are discussed in the next figures. To avoid repetition, mutually corresponding elements have the same reference numerals in this case and are not explained again.

Figure 13:
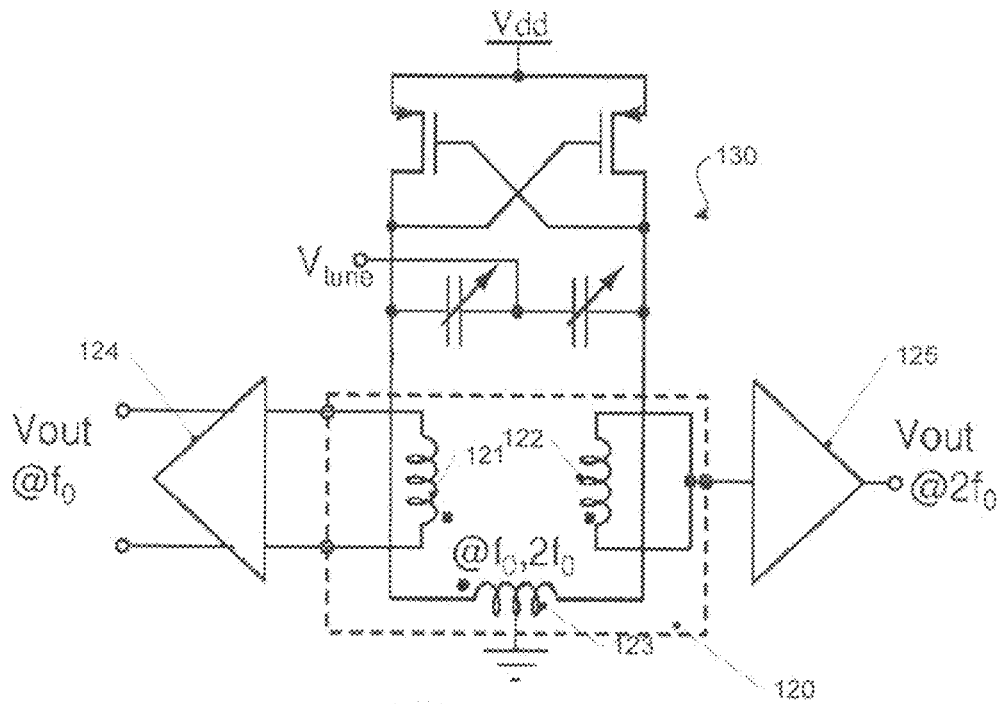

In FIG. 13, an oscillator 130 is coupled to the coupling apparatus 120. In this case, oscillator 130 is designed on the basis of cross-coupled PMOS transistors instead of the NMOS transistors of FIG. 12. Otherwise, the manner of operation of the apparatus of FIG. 13 corresponds substantially to that of the apparatus of FIG. 12.

Figure 14:
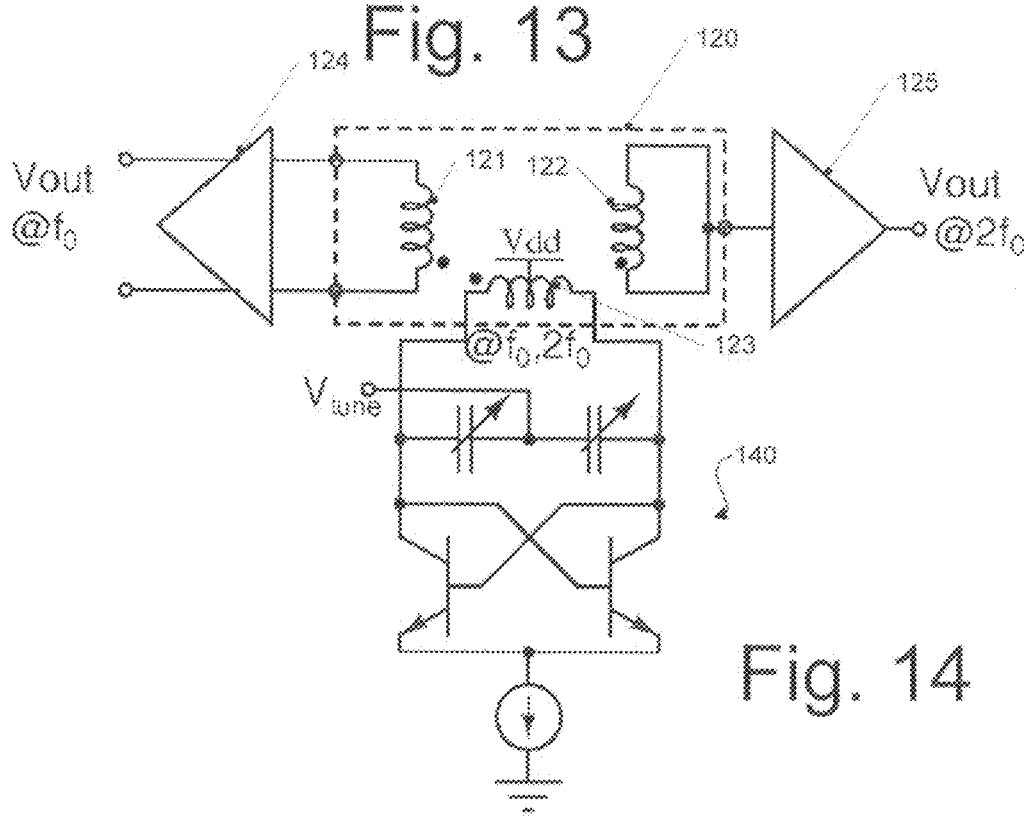

A further variant is depicted in FIG. 14. In this case, an oscillator 140 is connected to coupling apparatus 120. The design of the oscillator 140 largely corresponds to the design of the oscillator 126 of FIG. 12. In contrast to the latter, however, the oscillator 140 is implemented using cross-coupled bipolar transistors instead of the NMOS transistors of FIG. 12.

A further embodiment is depicted in FIG. 15. In the case of the embodiment of FIG. 15, an oscillator 150 coupled to the coupling apparatus 120 comprises a pair of cross-coupled PMOS transistors and a pair of cross-coupled NMOS transistors (what is known as a "current reusing" oscillator). The oscillator of FIG. 15 is therefore a combination of the oscillators of FIGS. 12 and 13, as it were. The use of two pairs of cross-coupled oscillators can decrease phase noise in some embodiments.

A further embodiment is depicted in FIG. 16. In the case of the embodiment of FIG. 16, an oscillator arrangement comprises a first oscillator core 165 having NMOS transistors and a second oscillator core 166 likewise having NMOS transistors, the cores each corresponding substantially to the oscillator 126 of FIG. 12. A coupling apparatus 160 of FIG. 16 accordingly comprises a first transmission coil 163 and a second transmission coil 164. Like the coupling apparatus 120, the coupling apparatus 160 furthermore comprises a first reception coil, which operates differentially and is coupled to the first buffer 124, and a second reception coil 162, which operates in unipolar fashion and is coupled to the second buffer 125. Apart from the presence of two transmission coils, the coupling apparatus 160 corresponds to the coupling apparatus 120 and operates in a similar fashion thereto and can be realized accordingly. By way of example, the additional transmission coil can be realized by a further coil in the stack of FIG. 7. In this case, oscillator cores 165, 166 are coupled via the magnetic field of the transmission coils 163, 164, so that the oscillators oscillate in phase and at the same frequency. Additionally, it should be noted that it is also possible for more than two cores to be provided.

Figure 18:
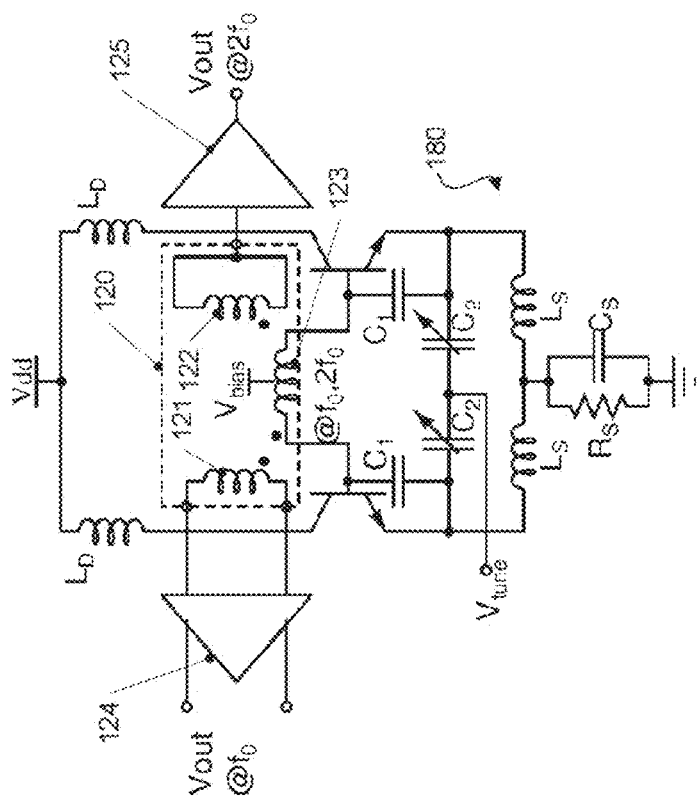
Figure 17:
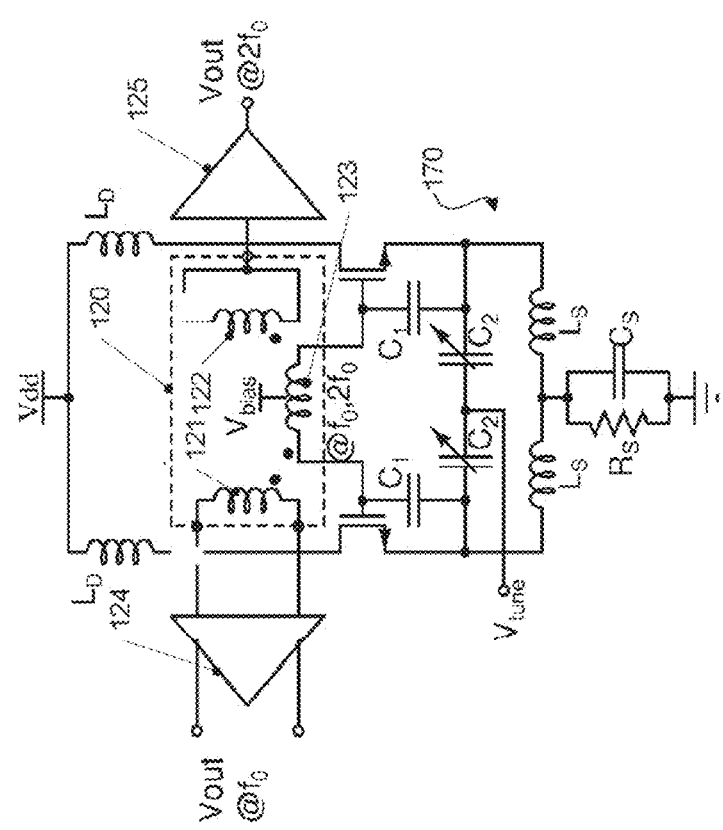

It is also possible for different types of oscillators to be used. In FIG. 17, the oscillator 170 depicted is what is known as a Colpitts VCO, which is in turn coupled to the coupling apparatus 120. Colpitts VCO 170 of FIG. 17 is in this case implemented on the basis of NMOS transistors. By contrast, FIG. 18 shows an implementation of a Colpitts VCO 180 on the basis of bipolar transistors, particularly heterojunction bipolar transistors (HBTs). Apart from the different transistor types, the circuit of FIG. 18 corresponds to that of FIG. 17.

Figure 19:
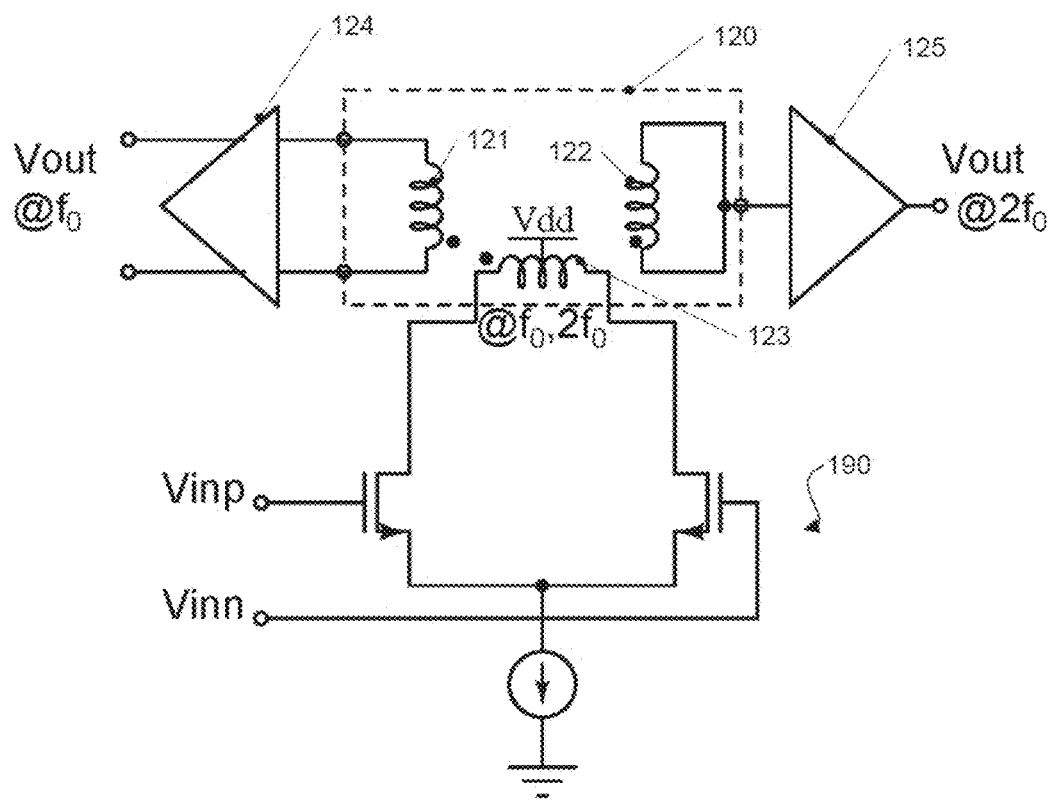

The application of coupling apparatuses as described is not restricted to oscillator circuits. As a further example, FIG. 19 shows a frequency multiplier 190 in which a frequency of a differential signal Vinp, Vinn is multiplied. In this case, too, the transmission coil 123 of the coupling apparatus 120 is supplied with a fundamental signal at the frequency $f_0$ as differential signal and with a harmonic at the frequency $2f_0$ (frequency-multiplied signal) as common mode signal, these then being able to be received separately by the reception coils 121, 122 as described.

Hence, coupling apparatuses according to embodiments can generally be used to couple out signals at different frequencies separately.

Figure 20:
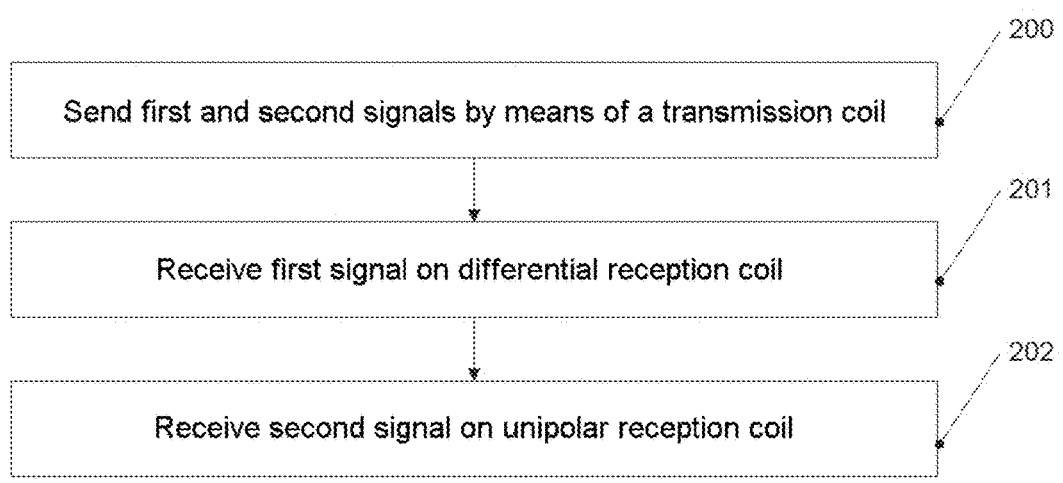
FIG. 20 shows a flowchart to illustrate a method according to an embodiment.

FIG. 20 depicts a flowchart to illustrate a method according to an embodiment. While FIG. 20 is depicted as a sequence of processes, the depicted order is not intended to be interpreted as limiting. In particular, some of the processes can also be effected at the same time in different parts of a circuit.

The method of FIG. 20 can be performed by means of the apparatuses discussed with reference to FIGS. 1-19, but is not restricted thereto. Modifications and variations that have been discussed with reference to FIGS. 1-19 are also applicable to the method of FIG. 20.

At 200 in FIG. 20, a first signal and a second signal are sent by means of a transmission coil, in particular coupled out from an out-coupling circuit part. The first and second signals have different frequencies in this case. By way of example, the second signal may be a higher harmonic of the first signal, or vice versa. The first signal can be supplied to the transmission coil in this case as a differential signal and the second signal can be supplied as a common mode signal.

At 201, the first signal is received on a differential reception coil, and at 202, the second signal is received on a unipolar reception coil (i.e. a reception coil whose ends are interconnected), the respective other signal being rejected. In this way, two different signals can be coupled efficiently.

As already stressed, the above embodiments serve merely for illustration and are not intended to be interpreted as limiting.

What is claimed is:

1. A coupling apparatus, comprising:
    an out-coupling element for sending a first signal and a second signal from an out-coupling circuit part,
    a first in-coupling element for receiving the first signal from the out-coupling element, the second signal being rejected, and
    a second in-coupling element for receiving the second signal from the out-coupling element, the first signal being rejected, wherein the coupling apparatus is configured to couple the out-coupling element to the first in-coupling element predominantly via a magnetic field and to couple the out-coupling element to the second in-coupling element predominantly via an electric field.

2. The coupling apparatus according to claim 1, wherein the out-coupling element is suppliable with the first signal as a differential signal and with the second signal as a common made signal, wherein the first signal is tappable at the first in-coupling element as a differential signal, and wherein the second signal is tappable at the second in-coupling element as a common made signal.

3. The coupling apparatus according to claim 1, wherein the out-coupling element comprises a coil, wherein the first in-coupling element comprises a coil having differential terminals, and wherein the coupling apparatus further comprises a third out-coupling element comprising a coil whose terminals are connected to one another.

4. A coupling apparatus, comprising:
    a transmission coil having a differential terminal,
    a first reception coil having a differential terminal, and
    a second reception coil, the second reception coil comprising ends that are connected to one another in order to form a unipolar terminal.

5. The coupling apparatus according to claim 4, wherein the transmission coil, the first reception coil and the second reception coil each comprise only one winding.

6. The coupling apparatus according to claim 4, wherein the transmission coil, the first reception coil and the second reception coil are arranged as a coil stack.

7. A circuit, comprising:
a coupling apparatus comprising
an out-coupling element for sending a first signal and a second signal from an out-coupling circuit part,
a first in-coupling element for receiving the first signal from the out-coupling element, the second signal being rejected, and
a second in-coupling element for receiving the second signal from the out-coupling element, the first signal being rejected, wherein the coupling apparatus is configured to couple the out-coupling element to the first in-coupling element predominantly via a magnetic field and to couple the out-coupling element to the second in-coupling element predominantly via an electric field;
an out-coupling circuit part for generating a first signal and a second signal;
a second circuit part for receiving the first signal from the out-coupling circuit part via the coupling apparatus, the second signal being rejected; and
a third circuit part for receiving the second signal from the out-coupling circuit part via the coupling apparatus, the first signal being rejected.

8. The circuit according to claim 7, wherein the second circuit part comprises a first buffer having a differential input that is coupled to the coupling apparatus.

9. The circuit according to claim 7, wherein the third circuit part comprises a second buffer having a unipolar input that is coupled to the coupling apparatus.

10. The circuit according to claim 7, wherein the out-coupling circuit part is configured to supply the coupling apparatus with the first signal as a differential signal and to supply the second signal as a common made signal.

11. The circuit according to claim 7, wherein the out-coupling circuit part is configured to generate the second signal as a harmonic of the first signal.

12. The circuit according to claim 7, wherein the out-coupling circuit part comprises an oscillator having cross-coupled transistors or comprises a Colpitts oscillator.

13. The circuit according to claim 7 wherein the out-coupling circuit part comprises a frequency multiplier or a frequency divider.

14. A method, comprising:
sending a first signal and a second signal via a transmission coil, wherein the first signal is supplied to the transmission coil as a differential signal and the second signal is supplied to the transmission coil as a common made signal,
receiving the first signal at a differential reception coil, and
receiving the second signal at a unipolar reception coil.

15. The method according to claim 14, further comprising generating the first signal and the second signal by an oscillator circuit.

16. The method according to claim 14, wherein the first signal has a different frequency from the second signal.

17. The method according to claim 14, wherein the transmission coil, the differential reception coil and the unipolar reception coil form a coupling apparatus comprising:
an out-coupling element for sending a first signal and a second signal from an out-coupling circuit part,
a first in-coupling element for receiving the first signal from the out-coupling element, the second signal being rejected, and
a second in-coupling element for receiving the second signal from the out-coupling element, the first signal being rejected, wherein the coupling apparatus is configured to couple the out-coupling element to the first in-coupling element predominantly via a magnetic field and to couple the out-coupling element to the second in-coupling element predominantly via an electric field.

18. The method according to claim 14, wherein the method is performed using a circuit comprising:
a coupling apparatus comprising
an out-coupling element for sending a first signal and a second signal from an out-coupling circuit part,
a first in-coupling element for receiving the first signal from the out-coupling element, the second signal being rejected, and
a second in-coupling element for receiving the second signal from the out-coupling element, the first signal being rejected, wherein the coupling apparatus is configured to couple the out-coupling element to the first in-coupling element predominantly via a magnetic field and to couple the out-coupling element to the second in-coupling element predominantly via an electric field;
an out-coupling circuit part for generating a first signal and a second signal;
a second circuit part for receiving the first signal from the out-coupling circuit part via the coupling apparatus, the second signal being rejected; and
a third circuit part for receiving the second signal from the out-coupling circuit part via the coupling apparatus, the first signal being rejected.

* * * * *